United States Patent
Le Blevennec et al.

(10) Patent No.: US 11,430,972 B2
(45) Date of Patent: Aug. 30, 2022

(54) METHOD FOR PRODUCING A LIGHT-EMITTING DIODE COMPRISING A STEP OF DIMENSIONING A SEMICONDUCTOR LAYER

(71) Applicant: COMMISSARIAT A L'ENERGIE ATOMIQUE ET AUX ENERGIES ALTERNATIVES, Paris (FR)

(72) Inventors: Gilles Le Blevennec, Grenoble (FR); Badhise Ben Bakir, Grenoble (FR); Eirini Sarelli, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 71 days.

(21) Appl. No.: 17/130,282

(22) Filed: Dec. 22, 2020

(65) Prior Publication Data
US 2021/0193976 A1     Jun. 24, 2021

(30) Foreign Application Priority Data
Dec. 23, 2019   (FR) ..................... 19 15502

(51) Int. Cl.
*H01L 21/00*        (2006.01)
*H01L 51/56*        (2006.01)
*H01L 51/50*        (2006.01)

(52) U.S. Cl.
CPC .......... *H01L 51/56* (2013.01); *H01L 51/502* (2013.01); *H01L 51/504* (2013.01)

(58) Field of Classification Search
CPC ............................... H01L 33/58; H01L 33/06
See application file for complete search history.

(56) References Cited

U.S. PATENT DOCUMENTS

| | | | | |
|---|---|---|---|---|
| 5,535,231 A | * | 7/1996 | Lee | ............ H01S 5/0261 |
| | | | | 372/50.21 |
| 2004/0251471 A1 | * | 12/2004 | Dwilinski | ........... H01S 5/32025 |
| | | | | 257/98 |
| 2007/0257269 A1 | | 11/2007 | Cho et al. | |
| 2010/0090234 A1 | | 4/2010 | Cho et al. | |
| 2010/0090242 A1 | | 4/2010 | Cho et al. | |

(Continued)

FOREIGN PATENT DOCUMENTS

| | | |
|---|---|---|
| EP | 1 855 327 A2 | 11/2007 |
| EP | 2 362 448 A1 | 8/2011 |

OTHER PUBLICATIONS

French Preliminary Search Report dated Aug. 27, 2020 in French Application 19 15502 filed Dec. 23, 2019 (with English Translation of Categories of Cited Documents and Written Opinion), 10 pages.

*Primary Examiner* — Caleb E Henry
(74) *Attorney, Agent, or Firm* — Oblon, McClelland, Maier & Neustadt, L.L.P.

(57) ABSTRACT

The invention relates to a method for producing a light-emitting diode, comprising a stack formed of a first semiconductor layer 11 and of an active layer 13, a reflective electrode 4 extending in contact with the first semiconductor layer 11, comprising a step of determining a distance between emitting dipoles that are located in the active layer 13 and the reflective electrode 4 for which a lifetime of the emitting dipoles having a chosen orientation is longer than that of the emitting dipoles having the non-chosen orientation.

9 Claims, 4 Drawing Sheets

(56) References Cited

U.S. PATENT DOCUMENTS

| | | |
|---|---|---|
| 2010/0090243 A1 | 4/2010 | Cho et al. |
| 2010/0093123 A1 | 4/2010 | Cho et al. |
| 2010/0155690 A1* | 6/2010 | Napolitano ......... H01L 51/0575 |
| | | 257/E47.001 |
| 2011/0198642 A1 | 8/2011 | Kim |
| 2011/0297993 A1 | 12/2011 | Cho et al. |
| 2012/0153254 A1 | 6/2012 | Mastro |
| 2013/0001625 A1 | 1/2013 | Cho et al. |
| 2014/0008676 A1 | 1/2014 | Wang et al. |
| 2014/0103291 A1 | 4/2014 | Mastro |
| 2014/0124814 A1 | 5/2014 | Cho et al. |
| 2015/0115221 A1* | 4/2015 | Nagel ................. H01L 31/0304 |
| | | 257/98 |
| 2015/0263252 A1 | 9/2015 | Wang et al. |
| 2016/0111598 A1 | 4/2016 | Cho et al. |
| 2016/0282271 A1* | 9/2016 | Ebbecke ............ G01N 21/9501 |
| 2017/0365801 A1* | 12/2017 | Margulies ........... H01L 51/0085 |
| 2020/0274080 A1* | 8/2020 | Britt .................... H01L 51/0091 |
| 2021/0193888 A1* | 6/2021 | Le Blevennec ......... H01L 33/44 |

* cited by examiner

METHOD FOR PRODUCING A LIGHT-EMITTING DIODE COMPRISING A STEP OF DIMENSIONING A SEMICONDUCTOR LAYER

TECHNICAL FIELD

The field of the invention is that of methods for producing light-emitting diodes that comprise an active layer located in a semiconductor stack of inorganic or organic layers.

PRIOR ART

Figure 1:
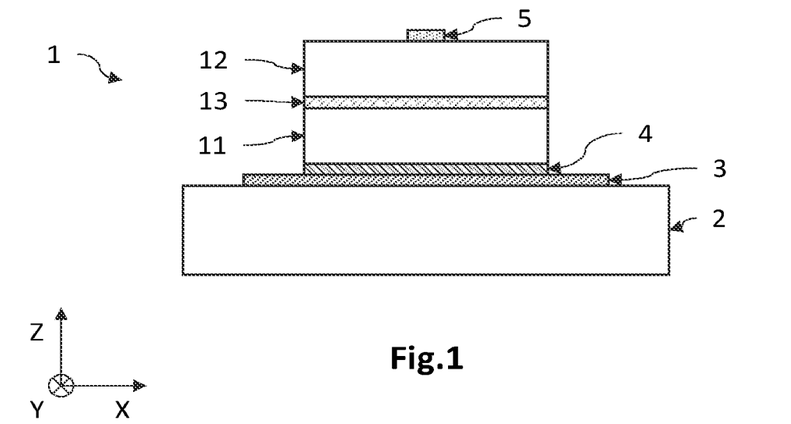
FIG. 1, described above, is a schematic and partial cross-sectional view of a light-emitting diode according to one example of the prior art.

FIG. 1 partially and schematically illustrates an example of a light-emitting diode 1 comprising a stack of semiconductor layers, here inorganic, including a first, P-doped layer 11, a second, N-doped layer 12, and an active layer 13 arranged between the two doped layers 11, 12 where most of the luminous radiation is emitted.

The light-emitting diode 1 rests here on a substrate 2 comprising a conductive layer 3, in contact with which is an advantageously reflective electrode 4 forming the anode. A preferably transparent electrode 5 forming a cathode rest on the N-doped layer 12. The reflective electrode 4 is preferably made of a metal material.

The active layer 13 may be formed, in the case of a PN junction, by the interface of the two doped layers 11, 12 in contact with one another or, in the case of a PIN junction, by at least one intrinsic layer 13 (i.e. a layer that is not intentionally doped) that may comprise one or more quantum wells. Each quantum well may be formed by a layer having a bandgap energy lower than that of the two barrier layers between which it is located, or may be formed by quantum dots.

The charge carriers (electrons and holes) are introduced into the semiconductor stack by the electrodes 4, 5, then diffuse to the active layer 13 where they recombine radiatively. The luminous radiation associated with the radiative recombination of the electron-hole pairs in the active layer 13 corresponds to the electric dipole radiation emitted by what is referred to as an emitting dipole which oscillates harmonically along the axis of its dipole moment $\mu$ (also called TDMV, for transition dipole moment vector).

Figure 2:
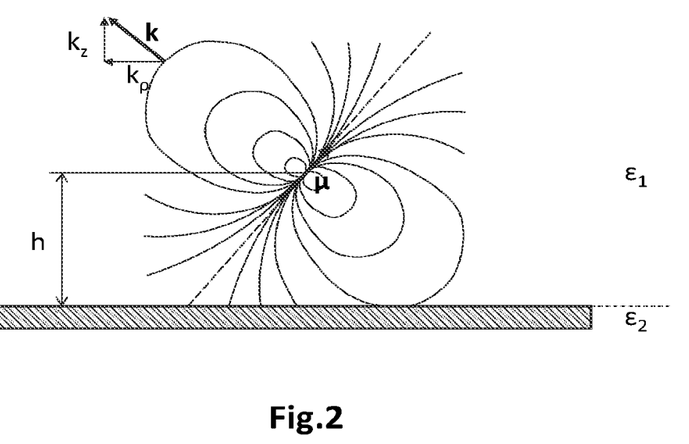
FIG. 2, described above, schematically illustrates an emitting dipole μ in a first uniform medium and located at a distance h from a second uniform medium, emitting a luminous radiation corresponding to a radiative recombination of an electron-hole pair.

FIG. 2 schematically illustrates an emitting dipole located in a first optically linear, uniform and isotropic medium (containing the active layer) of dielectric constant $\varepsilon_1$ (containing the active layer) and spaced apart from a second optically linear, uniform and isotropic medium of dielectric constant $\varepsilon_2$. It exhibits here a orientation inclined by an angle $\theta$ with respect to the axis Z orthogonal to the plan XY of the active layer. The field lines extend axisymmetrically about the axis of the dipole moment $\mu$. The wave vector k is orthogonal to the tangent at any point on a field line. As indicated in the article by Schmidt et al. entitled *Emitter Orientation as a Key Parameter in Organic Light-Emitting Diodes,* Phys. Rev. Applied, 8, 037001 (2017), the orientation of the emitting dipoles is a parameter that may affect the luminous efficacy of an emissive diode such as an organic light-emitting diode.

Document EP1855327A2 describes a light-emitting diode for which the distance between the active layer and a reflective layer is determined such that the emitting dipoles of the active layer have a horizontal orientation, thus improving the luminous efficacy.

There is thus a need for a method for producing at least one light-emitting diode whose luminous efficacy is further improved.

DISCLOSURE OF THE INVENTION

The objective of the invention is to overcome, at least in part, the drawbacks of the prior art, and more particularly to propose a method for producing at least one light-emitting diode exhibiting improved luminous efficacy.

To that end, the subject of the invention is a method for producing at least one light-emitting diode comprising a stack formed of a first semiconductor layer, of a second semiconductor layer, and of an active layer located between the two semiconductor layers, a reflective electrode extending in contact with the first semiconductor layer. The method comprises the following steps:

choosing the materials of the first semiconductor layer and of the active layer, and of the reflective electrode;

choosing an orientation, with respect to a plane of the active layer, of the what are referred to as "emitting" dipoles that are associated with the radiative recombination of electron-hole pairs in the active layer, from among: a horizontal orientation for which the emitting dipoles are oriented so as to be parallel to the plane of the active layer, and a vertical orientation for which the emitting dipoles are oriented so as to be orthogonal to the plane of the active layer;

choosing the materials of the second semiconductor layer, and of a third medium covering the second semiconductor layer;

determining a non-zero distance between the emitting dipoles and said third medium, for which a lifetime of the emitting dipoles having the chosen orientation is longer than that of the emitting dipoles having the non-chosen orientation, on the basis of a predetermined function expressing a change in a parameter representative of the lifetime of an emitting dipole having either of said orientations according to its distance from said third medium, taking into account the optical properties of said materials chosen;

determining a non-zero distance between the emitting dipoles and the reflective electrode, for which a lifetime of the emitting dipoles having the chosen orientation is longer than that of the emitting dipoles having the non-chosen orientation, on the basis of a predetermined function expressing a change in a parameter representative of the lifetime of an emitting dipole having either of said orientations according to its distance from the reflective electrode, taking into account the optical properties of said materials chosen;

producing the light-emitting diode, a thickness of the first semiconductor layer being such that the emitting dipoles are located at the determined distance with respect to the reflective electrode, and a thickness of the second semiconductor layer being such that the emitting dipoles are located at the determined distance with respect to said third medium.

Some preferred but non-limiting aspects of this method are the following.

The determining step may comprise the following steps:

determining, over a predefined distance range, the change according to the distance in the parameter representative of the lifetime of the emitting dipole having the chosen orientation, and the change according to the distance in the parameter representative of the lifetime of the emitting dipole having the non-chosen orientation;

determining what is referred to as a "difference" parameter representative of a difference in the parameter representative of the lifetime of the emitting dipole having the chosen orientation with respect to the parameter representative of the lifetime of the emitting dipole having the non-chosen orientation, over said predefined distance range;

determining said distance such that:
the parameter representative of the lifetime of the emitting dipole having the chosen orientation is greater, for the determined distance, than that of the parameter representative of the lifetime of the emitting dipole having the non-chosen orientation, and that:
the difference parameter has, for the determined distance, a maximum value over at least a portion of the distance range.

The determined distance may be defined along an axis orthogonal to the plane of the active layer, and is defined between, on the one hand, the interface between the reflective electrode and the first semiconductor layer and, on the other hand, a plane passing through halfway through the thickness of the active layer.

The active layer may comprise at least one quantum well emissive layer, and a barrier layer located between the first semiconductor layer and the emissive layer, the determined distance being defined along an axis orthogonal to the plane of the active layer, between, on the one hand, the interface between the reflective electrode and the first semiconductor layer and, on the other hand, a plane passing through halfway through the thickness of the emissive layer.

The reflective electrode may extend parallel to the plane of the active layer.

The reflective electrode may be an anode capable of injecting holes into the semiconductor stack.

The first semiconductor layer may be made of a P-doped semiconductor crystalline material, or may be made of a hole-conducting organic semiconductor material.

The second semiconductor layer may be coated with what is referred to as an "extraction" layer comprising nanoscale particles chosen from among quantum dots or metal particles.

The nanoscale particles may be metal particles, in which case the chosen orientation is preferably a vertical orientation.

BRIEF DESCRIPTION OF THE DRAWINGS

Other aspects, aims, advantages and features of the invention will become more clearly apparent from reading the following detailed description of preferred embodiments thereof, which description is given by way of non-limiting example and with reference to the appended drawings, in which.

DETAILED DISCLOSURE OF PARTICULAR EMBODIMENTS

In the figures and in the remainder of the description, the same references have been used to designate identical or similar elements. In addition, the various elements are not shown to scale for the sake of clarity of the figures. Moreover, the various embodiments and variants are not mutually exclusive and may be combined with one another. Unless indicated otherwise, the terms "substantially", "about" and "of the order of" mean to within 10%, and preferably to within 5%. Moreover, the terms "comprised between . . . and . . . " and equivalents mean that the bounds are included, unless indicated otherwise.

The invention relates to a method for producing at least one light-emitting diode exhibiting improved luminous efficacy. The luminous efficacy is defined here as the ratio of the luminous flux emitted by the light-emitting diode to the electrical power injected, and corresponds to the external quantum efficiency (EQE). It is equal to the product of the internal quantum efficiency (IQE) and of the light extraction efficiency. The internal quantum efficiency is the ratio of the number of photons generated by radiative recombination to the number of electrons injected by the cathode, and the light extraction efficiency is the ratio of the number of photons emitted out of the diode to the number of photons generated.

For that, as explained in detail below, at least one of the semiconductor layers of the light-emitting diode is dimensioned such that the emitting dipoles associated with the radiative recombination of the electron-hole pairs in the active layer have a predefined orientation, which is chosen between two mutually orthogonal predefined orientations, i.e. a horizontal orientation and a vertical orientation. The horizontal or vertical character of the orientation of the emitting dipole is in relation to a plane along which the active layer of the light-emitting diode extends. In addition, the orientation of an emitting dipole corresponds to the angle of inclination θ formed by the dipole moment μ of the emitting dipole with respect to an axis orthogonal to the plane of the active layer.

Figure 3:
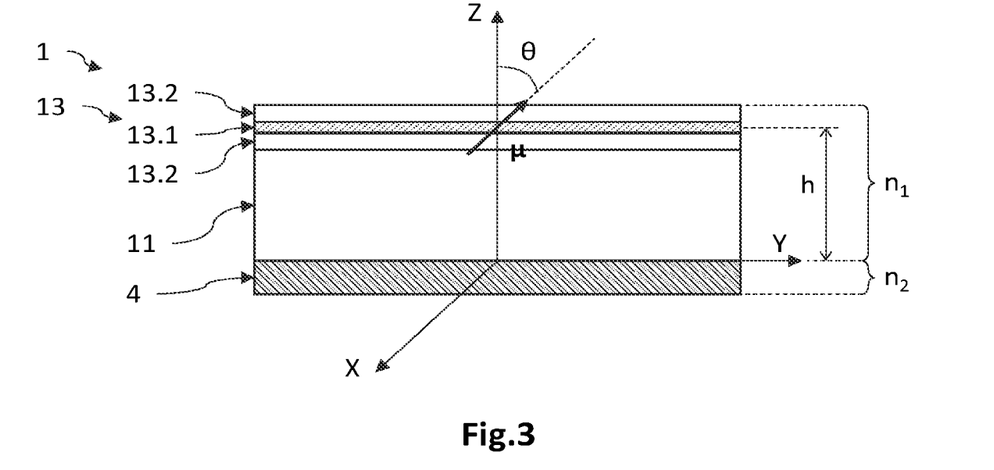
FIG. 3 is a schematic and partial cross-sectional view of a light-emitting diode obtained according to a production method according to one embodiment, illustrating an emitting dipole located in an active layer and arranged at a distance h from a reflective electrode.

FIG. 3 is a schematic and partial cross-sectional view of an example of a light-emitting diode 1. This light-emitting diode 1 is similar to that described above, and is here obtained by means of a production method according to one embodiment.

An orthogonal direct coordinate system XYZ, in which the axes X and Y form a plane parallel to the main plane of a substrate (not shown) on which the light-emitting diode 1 rests, and in which the axis Z is oriented orthogonally to the plane XY, is defined here and will be referred to in the rest of the description. Here, the active layer 13 extends along the plane XY, as does the reflective electrode 4.

The light-emitting diode 1 thus comprises a semiconductor stack formed of a first layer 11, of an active layer 13, and of a second layer 12 (see FIG. 1). In this example, the semiconductor stack is produced on the basis of an inorganic crystalline semiconductor material, but, as a variant, it may be produced on the basis of an organic semiconductor material (OLED). The light-emitting diode 1 may comprise additional layers which are not shown, for example an electron-blocking layer, a buffer layer for matching the lattice parameter, etc.

What is meant by produced on the basis of semiconductor material is that the semiconductor stack is made of this semiconductor material or of one or more compounds comprising this semiconductor material. By way of example, the semiconductor stack is produced on the basis of a III-V compound, for example of the basis of GaN, and may thus comprise at least one semiconductor layer made of doped or undoped GaN, and at least one semiconductor layer made of a compound comprising GaN, for example of InGaN, AlGaN, InAlGaN, or is even produced on the basis of InP, for example of the type AlInGaP.

It is noted here, as indicated above, that the light-emitting diode 1 may be an organic diode, in which case it is formed of two, anode and cathode, electrodes between which organic semiconductor layers are stacked, including an electron transport layer (ETL), an active layer (EML) and a hole transport layer (HTL).

In this example where the light-emitting diode 1 is produced on the basis of an inorganic material, the semiconductor stack is produced on the basis of GaN, the first layer 11 is made of P-doped GaN, the second layer 12 is made of N-doped GaN. The active layer 13 comprises here a quantum well layer 13.1 made of intrinsic InGaN located between two barrier layers 13.2 made of intrinsic GaN. Of course, the active layer 13 may comprise a plurality of quantum well layers located between two barrier layers. The reflective electrode 4 is made of one or more metal materials chosen from among silver, aluminum, copper, titanium, gold, nickel, iridium, tungsten, indium, inter alia. It extends in contact with the first layer 11. It is referred to as reflective insofar as its reflection coefficient is at least equal to 75%, at least equal to 85%, or even to 95%, or even more, at the emission wavelength of the light-emitting diode 1. The active layer 13 extends along a plane XY parallel to that of the reflective electrode 4.

Since the active layer 13 is the main location of the radiative recombination of the electron-hole pairs, the emitting dipoles are located in the active layer 13, and are therefore spaced by a distance h with respect to the reflective electrode 4. It is considered that they are located in a plane spaced by the non-zero distance h from the reflective electrode 4. Let h=0 denote the interface between the reflective electrode 4 and the first layer 11.

The distance h separating the emitting dipoles from the reflective electrode 4 is defined for the rest of the description as being the distance along the axis Z between a plane passing through halfway through the thickness of the active layer 13, and the reflective electrode 4. However, as a variant, and notably when the active layer 13 comprises a plurality of quantum well emissive layers 13.1, the distance h may be defined as being the distance along the axis Z between, on the one hand, a plane passing through halfway through the thickness of the first quantum well layer 13.1 and, on the other hand, the reflective electrode 4. A prior study may be carried out in order to determine where exactly in the active layer 13 most of the radiative recombination of the electron-hole pairs is located.

In this example, the distance h is therefore equal to the sum of the thickness of the first layer 11, of the thickness of the barrier layer 13.2, and of halfway through the thickness of the emissive layer 13.1.

The orientation of an emitting dipole corresponds to the angle θ between the dipole moment μ of the emitting dipole and the axis Z orthogonal to the plane XY of the active layer 13. Thus, an angle θ equal to 0° corresponds to a vertical orientation of the emitting dipoles with respect to the plane of the active layer 13, and an angle θ equal to 90° corresponds to a horizontal orientation.

It is additionally considered that the emitting dipoles are located in a first optically linear, uniform and isotropic medium of dielectric constant $\varepsilon_1$ (relative permittivity) and of refractive index $n_1$, this first uniform medium being formed of the active layer 13 and of the first layer 11. What is meant by optically uniform is that the dielectric constant $\varepsilon_1$ is substantially constant at any point in this first uniform medium, to within 10%, or even to within 5%, or even less. The reflective electrode 4 forms a second optically linear, uniform and isotropic medium of dielectric constant $\varepsilon_2$ and of refractive index $n_2$.

The method for producing a light-emitting diode 1 comprises a phase of determining a non-zero distance denoted by $h_s$ between the emitting dipoles associated with the radiative recombination in the active layer 13 and the reflective electrode 4, such that the emitting dipoles have an orientation chosen from among the horizontal orientation (θ=90°) and the vertical orientation (θ=0°). The thickness of the first layer 11 may then be determined by taking the value $h_s$ into account.

For that, a function g is predetermined which expresses a change, according to the distance h, in a parameter representative of a lifetime of an emitting dipole having one or the other of said orientations, according to the optical properties $n_1$, $n_2$ of the first and second uniform media. Thus, the function g is denoted by $g_h$ or $g_v$ when it is in relation to a horizontal (θ=90°) or vertical (θ=0°) orientation. It is denoted by $g_s$ or $g_{ns}$ when it is in relation to the chosen orientation or to the non-chosen orientation.

The lifetime τ is defined as being that of an emitting dipole located in an optically uniform medium of dielectric constant ε. It corresponds to the lifetime of the spontaneous emission of a two-level system, for which it is considered, to a first approximation, that it is identical to the lifetime of the emitting dipoles in the context of electroluminescence. Let $\tau_n$ denote the normalized lifetime equal to the ratio of the lifetime $\tau/\tau_0$, where the lifetime $\tau_0$ is defined as being that of an emitting dipole located in the same medium but of infinite dimensions, hence at an infinite distance from the second uniform medium.

Now, the normalized lifetime $\tau_n$ is equal to the inverse of the normalized radiated power $P/P_0$ of the emitting dipole, in other words: $\tau_n = \tau/\tau_0 = P_0/P$. Here, P is the energy dissipation rate of the emitting dipole, in other words the optical power radiated by the emitting dipole in the first uniform medium and located at a distance h from the second uniform medium, and $P_0$ is the optical power radiated by the same emitting dipole in the first uniform medium of infinite dimensions (i.e. far from the second uniform medium, for example more than 500 nm away therefrom).

The work by Novotny & Hecht entitled *Principles of Nano-Optics*, Cambridge University Press, 2006, indicates on page 344 (equation No. 10.26) an expression for the normalized radiated optical power $P/P_0$ of an emitting dipole located in a first uniform medium at a distance h from a substrate formed of a second uniform medium (thin layer) and of a third uniform medium.

This equation may be adapted for the present configuration of a light-emitting diode 1 where the emitting dipole is located in the first uniform medium formed of the active layer 13 and of the first layer 11 and arranged at a distance h from the second uniform medium formed of the reflective electrode 4. Thus, the normalized optical power radiated by such an emitting dipole may be written as:

$$\frac{P}{P_0} = 1 + \frac{3}{4}\frac{\mu_x^2 + \mu_y^2}{\mu^2}\int_0^\infty \text{Re}\left(\frac{s}{s_z}[r^s - s_z^2 r^p]e^{2ik_1 h s_z}\right)ds +$$

$$\frac{3}{2}\frac{\mu_z^2}{\mu^2}\int_0^\infty \text{Re}\left(\frac{s^3}{s_z}r^p e^{2ik_1 h s_z}\right)ds$$

where:
- $\mu$ is the norm of the dipole moment, and $\mu_{x,y,z}$ is the Cartesian coordinate of the dipole moment along the axis x, y or z;
- s is the variable of integration defined by $s=k_\rho/k_1$, with:
  - $k_\rho$ the projection of the wave vector k in the plane XY, such that $k_\rho = k_x/\cos\phi$ and $k_\rho = k_y/\sin\phi$; and $k_1$ is the norm of the wave vector k in the medium 1;
- $s_z$ equal to $(1-s^2)^{1/2}$;
- $r^s$ and $r^p$ are the reflection coefficients of the optical radiation emitted by the emitting dipole for the s and p polarizations at the interface between the first layer 11 and the reflective electrode 4. These coefficients are dependent on the variable of integration s and their general expressions are given by the equations 10.20 and 10.21 on p. 342 of Novotny & Hecht 2006.

However, in the configuration according to the invention, the reflection coefficient $r^p$ at the interface with the reflective electrode 4 for the luminous radiation of p polarization may be written, according to the variable of integration s, in the following manner:

$$r^p = \frac{\tan\left[\tan^{-1}\left(\frac{s}{s_z}\right) - \sin^{-1}\left(\frac{n_1}{n_2}\sin\left(\tan^{-1}\left(\frac{s}{s_z}\right)\right)\right)\right]}{\tan\left[\tan^{-1}\left(\frac{s}{s_z}\right) + \sin^{-1}\left(\frac{n_1}{n_2}\sin\left(\tan^{-1}\left(\frac{s}{s_z}\right)\right)\right)\right]}$$

Furthermore, the reflection coefficient $r^s$ at the interface with the reflective electrode 4 for the luminous radiation of s polarization may be written, according to the variable of integration s, in the following manner:

$$r^s = -\frac{\sin\left[\tan^{-1}\left(\frac{s}{s_z}\right) - \sin^{-1}\left(\frac{n_1}{n_2}\sin\left(\tan^{-1}\left(\frac{s}{s_z}\right)\right)\right)\right]}{\sin\left[\tan^{-1}\left(\frac{s}{s_z}\right) + \sin^{-1}\left(\frac{n_1}{n_2}\sin\left(\tan^{-1}\left(\frac{s}{s_z}\right)\right)\right)\right]}$$

Additionally, the term $\mu_z^2/\mu^2$ corresponds to $\cos\theta$, and the term $(\mu_x^2 + \mu_y^2)/\mu^2$ is equal to $\sin\theta$. The wave vector k has, in the first uniform medium, a norm denoted by $k_1$ equal to $2\pi/(n_1 \times \lambda)$. As mentioned above, $n_1$ and $n_2$ are the refractive indices of the first and second uniform media, which are deduced from the dielectric constants $\varepsilon_1$, $\varepsilon_2$.

Thus, the radiated power P radiated by the emitting dipole is formed of three main terms, namely the intrinsic radiated power $P_0$ (apart from any effect associated with the environment of the first uniform medium), a term corresponding to the radiated power associated with the dipole moment $\mu_x$ and $\mu_y$ in the plane XY and a term corresponding to the radiated power associated with the dipole moment $\mu_z$ along the axis Z.

This equation is obtained on the basis of Maxwell's equations, using dyadic Green's functions to describe a single oscillating point dipole, and the angular spectrum method for the field of the dipole extends the Green's functions to plane and evanescent waves, respectively, in a cylindrical system. The emitting dipole therefore interacts with its own reflected plane and evanescent waves.

Thus, a function g is obtained that expresses the change in a parameter representative of the lifetime of an emitting dipole of predefined orientation $\theta$ according to the distance h from the reflective electrode 4, taking into account the optical properties $n_1$ of the first uniform medium (first layer 11 and active layer 13) and those nz of the second uniform medium (reflective electrode 4). The representative parameter is preferably the normalized lifetime $\tau_n = \tau/\tau_0$.

Figure 4A:
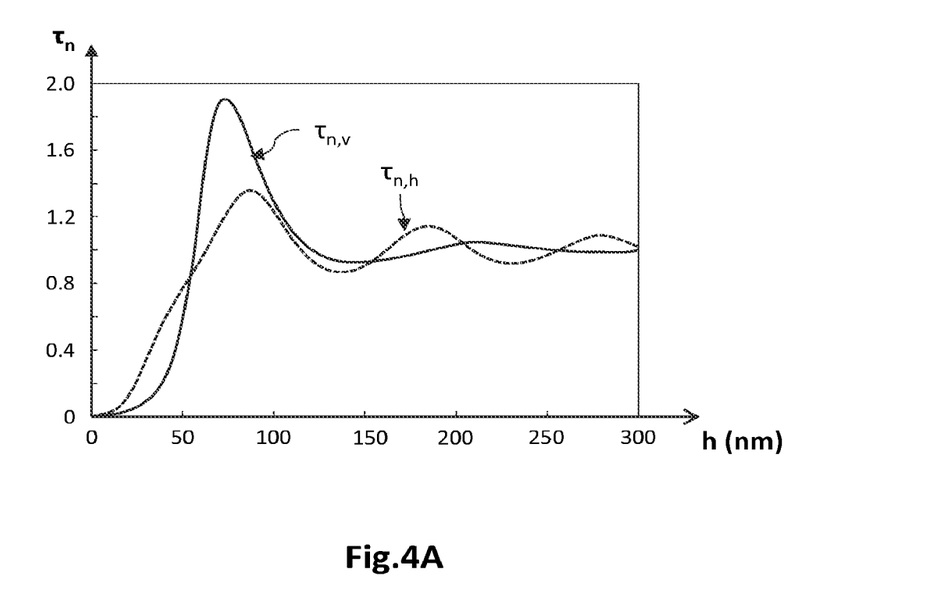
FIG. 4A illustrates one example of changes, according to the distance h, in the normalized lifetime $\tau_{n,v}$ of an emitting dipole μ of vertical orientation and that $\tau_{n,h}$ of an emitting dipole μ of horizontal orientation, in the case where the first uniform medium is produced on the basis of GaN, and where the second uniform medium (P electrode) is made of silver, for an emission wavelength equal to 460 nm.

FIG. 4A illustrates one example of changes, according to the distance h, in the normalized lifetime $\tau_{n,v}$ of an emitting dipole of vertical orientation and that $\tau_{n,h}$ of an emitting dipole of horizontal orientation, in the case where the first uniform medium is produced on the basis of GaN, and where the second uniform medium is made of silver, for an emission wavelength equal to 460 nm. These changes are determined on the basis of the function g described above, and are given over a predefined distance range $\Delta h_{ref}$ ranging from 0 nm to 300 nm.

More precisely, the light-emitting diode 1 comprises an emissive layer made of InGaN (no barrier layer made of intrinsic GaN) and a first layer 11 made of P-doped GaN which together form the first uniform medium. The refractive index $n_1$ is equal to about 2.4764 for an emission wavelength of $\lambda=460$ nm. The first layer 11 is in contact with a reflective electrode 4 made of silver which forms the second uniform medium and has a refractive index $n_2$ that is equal to the square root of its dielectric constant $\varepsilon_2$ equal to $-7.5666 + i \times 0.24451$.

It is seen that the normalized lifetimes $\tau_{n,v}$, $\tau_{n,h}$ are zero when the distance h is zero, then increase up to a first peak, and then vary as the distance h increases while exhibiting damped oscillations around substantially equal constant values.

Given that the changes in the normalized lifetimes $\tau_{n,v}$, $\tau_{n,h}$ according to the distance h are not in phase with one another and tend toward one and the same constant value for large h, it is seen that the lifetime associated with one of the orientations predominates over the lifetime associated with the other orientation for a plurality of domains $\Delta h_{i=1,2\ldots}$ of distance h in the range $\Delta h_{ref}$, and that this predominance alternates according to the distance h.

Thus, it is possible to determine a distance $h_s$ for which the normalized lifetime $\tau_{n,s}$ associated with the chosen orientation of the emitting dipoles is longer than the normalized lifetime $\tau_{n,ns}$ associated with the other, non-chosen orientation. In this case, the emitting dipoles having the chosen orientation will predominate over those having the non-chosen orientation. The light-emitting diode 1 may then be dimensioned, in particular the thickness of the first layer 11, such that the emitting dipoles are located at the distance $h_s$ from the reflective electrode 4.

Figure 4B:
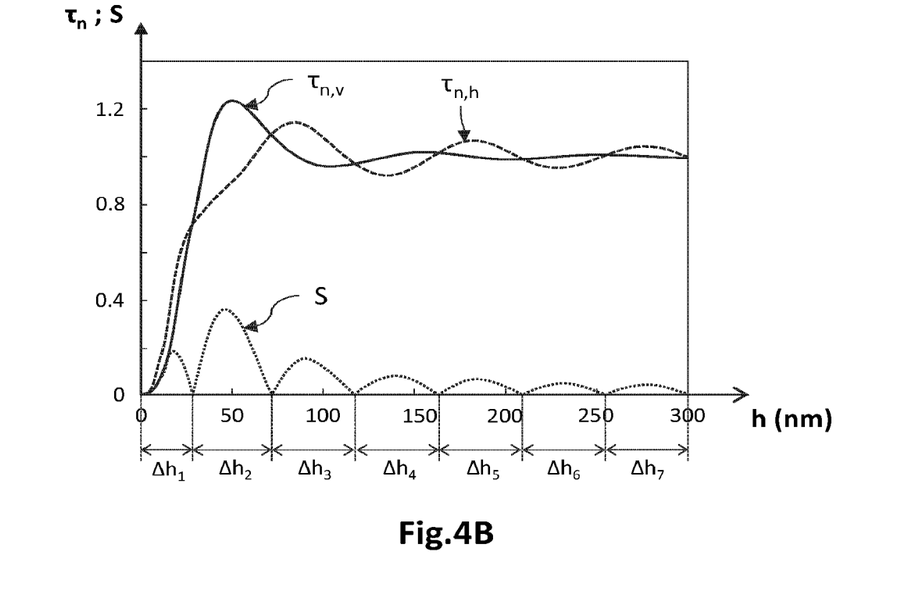
FIG. 4B illustrates another example of changes, according to the distance h, in the normalized lifetime $\tau_{n,v}$ of an emitting dipole μ of vertical orientation and that $\tau_{n,h}$ of an emitting dipole μ of horizontal orientation, in the case where the first uniform medium is produced on the basis of GaN, and where the second uniform medium is made of gold, for an emission wavelength equal to 460 nm, and also illustrates the change, according to the distance h, in a parameter called the selectivity S that is representative of a difference between these two normalized lifetimes $\tau_{n,v}$, $\tau_{n,h}$.

FIG. 4B illustrates another example of changes, according to the distance h, in the normalized lifetime $\tau_{n,v}$ of an emitting dipole of vertical orientation and that $\tau_{n,h}$ of an emitting dipole of horizontal orientation, in the case where the first uniform medium is produced on the basis of GaN, and where the second uniform medium is made of gold, for an emission wavelength equal to 460 nm. It also illustrates the change, according to the distance h, in a parameter S called the selectivity parameter that is representative of a difference between these two normalized lifetimes $\tau_{n,v}$, $\tau_{n,h}$.

In this example, the first uniform medium of refractive index ni is formed of the first layer 11 made of P-doped GaN and of an emissive layer made of InGaN (no barrier layer made of intrinsic GaN). The second uniform medium of refractive index $n_2$ is formed by the reflective electrode 4 made here of gold. The emission wavelength is equal to 460 nm.

As above, the normalized lifetime $\tau_n$ of the emitting dipoles having a horizontal or vertical orientation increases from a zero value for h equal to zero to a first peak, then tends toward one and the same constant value while exhibiting damped oscillations. The constant values are substantially equal for both orientations. However, since the oscillations are not in phase with one another, there are domains $\Delta h_{i=1,2\ldots}$ in the range $\Delta h_{ref}$ for which the normalized lifetime associated with one of the orientations predominates over the normalized lifetime associated with the other orientation. It is then possible to dimension the light-emitting diode 1, in particular to choose a value $h_s$ of the distance, such that the emitting dipoles predominantly have the chosen orientation over the non-chosen orientation.

In this example, the emitting dipoles of vertical orientation predominate in the domains $\Delta h_2$, $\Delta h_4$, $\Delta h_6$ in the range $\Delta h_{ref}$ going from zero to 300 nm. Furthermore, the emitting dipoles of horizontal orientation predominate in the domains $\Delta h_1$, $\Delta h_3$, $\Delta h_5$, $\Delta h_7$. Thus, dimensioning the light-emitting diode so that the distance $h_s$ is in the domain $\Delta h_1$ or $\Delta h_3$, for example, will make it possible to obtain radiative recombination of the electron-hole pairs, the emitted radiation of which corresponds to that of emitting dipoles having an essentially horizontal orientation. However, a distance $h_s$ in the domain $\Delta h_2$ or $\Delta h_4$, for example, will make it possible to obtain radiative recombination of the electron-hole pairs, the emitted radiation of which corresponds to that of emitting dipoles having an essentially vertical orientation.

As mentioned above, to obtain a preponderance of the emitting dipoles having the chosen orientation over those having the non-chosen orientation, it is important for the lifetime of the emitting dipoles having the chosen orientation to be longer than that of the emitting dipoles having the other orientation.

It is then advantageous for the distance $h_s$ to be determined such that a difference between the normalized lifetimes of the emitting dipoles of horizontal and vertical orientation is maximum in terms of absolute value.

Thus, it is possible to define a parameter referred to as the difference parameter S, called selectivity, representative of a difference between the normalized lifetime $\tau_{n,s}$ of an emitting dipole having the chosen orientation and the normalized lifetime $\tau_{n,ns}$ of an emitting dipole having the non-chosen orientation. This selectivity S may be defined as being the difference or the ratio, in terms of absolute value or otherwise, between the normalized lifetime $\tau_{n,s}$ of an emitting dipole having the chosen orientation and the normalized lifetime $\tau_{n,ns}$ of an emitting dipole having the non-chosen orientation. In other words, $S=\tau_{n,s}-\tau_{n,ns}$ or, as a variant, $S=\tau_{n,s}/\tau_{n,ns}$. Hereinafter, $S=\tau_{n,s}-\tau_{n,ns}$ is used.

FIG. 4B also illustrates the change according to the distance h in the absolute value |S| of the selectivity S. This thus cancels out between each domain $\Delta h_i$ and has a maximum value for each of them. By way of example, the selectivity has a value of 0.18 for 18 nm in $\Delta h_1$ (horizontal orientation), a value of 0.36 for 46 nm in $\Delta h_2$ (vertical orientation), a value of 0.15 for 90 nm in $\Delta h_3$ (horizontal orientation), and a value of 0.08 for 140 nm in $\Delta h_4$ (vertical orientation). It is therefore seen that the various domains do not have a selectivity S of the same intensity, indicating that the normalized lifetimes change according to the distance h in the form of damped oscillations.

Thus, to improve the luminous efficacy of a light-emitting diode 1, it is possible to dimension it such that the emitting dipoles have a predefined orientation, for example horizontal. For that, the distance $h_s$ is chosen in one of the domains $\Delta h_i$ in the range $\Delta h_{ref}$ for which the lifetime of the emitting dipoles having the predefined orientation is longer than that of the emitting dipoles having the other orientation. In addition, the distance hs is advantageously determined such that the selectivity S has a maximum in the determined distance range $\Delta h_{ref}$. In this example, to obtain a predominance of the emitting dipoles of horizontal orientation, it is advantageous for the distance $h_s$ to be equal to 18 nm given that the selectivity S has a maximum equal to 0.18.

Figure 5:
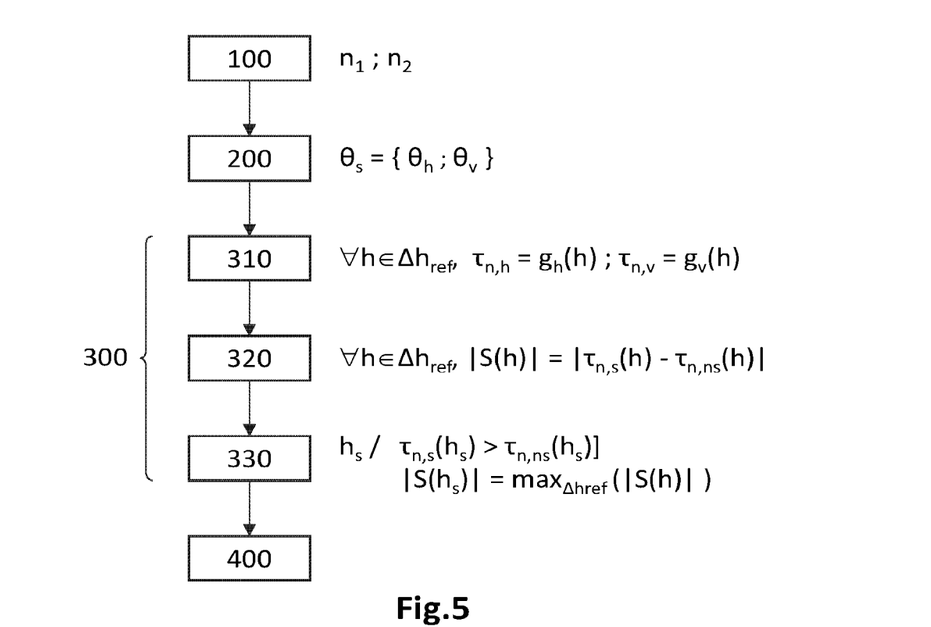
FIG. 5 is a flowchart of various steps of a method for producing a light-emitting diode according to one embodiment.

FIG. 5 is a flowchart illustrating steps of a method for producing a light-emitting diode 1 according to one embodiment. The production method is here illustrated in the case of a light-emitting diode 1 comprising a semiconductor stack of inorganic type. In this example, the first layer 11 is made of P-doped GaN, and an active layer 13 is formed of a quantum well emissive layer made of InGaN. The reflective electrode 4 is made of silver.

In a step 100, the materials of the first layer 11 and of the active layer 13, which together form the first uniform medium of refractive index $n_1$, are chosen. Here they are P-doped GaN and InGaN, the refractive index of which is substantially equal for these two materials and corresponds to 2.4764 at the emission wavelength of 460 nm. In the case where the refractive indices are not identical, it is possible to define an average refractive index on the basis for example of a volume weighting of the refractive indices. The material of the reflective electrode 4 is also chosen, which forms the second uniform medium of refractive index $n_2$ (obtained on the basis of the dielectric constant $\varepsilon_2$). In the case of silver, the refractive index $n_2$ is equal to $0.044439+i\times2.7511$.

As mentioned above, the distance h corresponds here to the distance along the axis Z between the reflective electrode 4/first layer 11 interface and halfway through the thickness of the active layer 13. In this example, the active layer 13 is a quantum well emissive layer 13.1 with a thickness of 3 nm, and it is desired to determine the thickness of the first layer 11 such that the emitting dipoles (located, to a first approximation, at the center of the active layer 13) are located at the determined distance $h_s$ in order to obtain the chosen dipole orientation.

In a step 200, the desired orientation $\theta_s$ of the emitting dipoles that are associated with the radiative recombination of the electron-hole pairs in the active layer 13, i.e. here the angle $\theta$ formed by the dipole moment $\mu$ with respect to the axis Z orthogonal to the plane of the active layer 13, is chosen from among the vertical orientation $\theta_v$ ($\theta=0°$) and the horizontal orientation $\theta_h$ ($\theta=90°$). In this example, the chosen orientation $\theta_s$ is the horizontal orientation $\theta_h$ ($\theta_s=90°$).

In a step 300, a value $h_s$ of the distance h is determined such that a lifetime of the emitting dipoles having the chosen orientation $\theta_s$ is longer than that of the emitting dipoles having the non-chosen orientation $\theta_{ns}$. For that, the predetermined function g expressing a relationship between a lifetime of an emitting dipole having a predefined orientation $\theta$ and the distance h is used. This function g is that described above, which expresses the change in the normalized lifetime $\tau_n$ of an emitting dipole according to the distance h, by means of the normalized radiated optical power $P/P_0$.

Thus, in a sub-step 310, the change $g_h$ according to h in the normalized lifetime 96 $_{n,h}$ of an emitting dipole of horizontal orientation $\theta_h$ and the change $g_v$ in the normalized lifetime 96 $_{n,v}$ of an emitting dipole of vertical orientation $\theta_v$ are determined over a distance range $\Delta h_{ref}$ ranging for example from 0 nm to 300 nm. These changes $g_h$ and $g_v$ are determined on the basis of the relationships $\tau_n = P_0/P$ and $P/P_0 = f(h)$ indicated above. Thus, $\tau_{n,v} = g_v(h)$ and $\tau_{n,h} = g_h(h)$ are obtained for any h within the range $\Delta h_{ref}$.

In a sub-step 320, the lifetime of the emitting dipole of chosen orientation $\tau_{n,h}$ is compared with the lifetime of the emitting dipole of non-chosen orientation $\tau_{n,v}$ for all h within $\Delta h_{ref}$. The selectivity parameter S is advantageously determined such that, for all h within $\Delta h_{ref}$, the absolute value |S| of the selectivity S is equal to the absolute value of the difference between the lifetime $\tau_{n,s}$ of the emitting dipole of chosen orientation and the lifetime $\tau_{n,ns}$ of the emitting dipole of non-chosen orientation, i.e. here: $|S(h)|=|\tau_{n,h}(h)-\tau_{n,v}(h)|$.

In a sub-step 330, a value $h_s$ is then determined such that the lifetime $\tau_{n,s}$ of the emitting dipole of chosen orientation $\theta_s$ is longer than the lifetime $\tau_{n,ns}$ of the emitting dipole of non-chosen orientation $\theta_{ns}$, i.e. here such that $\tau_{n,h}(h_s) > \tau_{n,v}(h_s)$. Additionally, the value $h_s$ is advantageously determined such that the selectivity $|S(h_s)|$ is maximum over at least one domain in the range $\Delta h_{ref}$, and preferably over the entire range $\Delta h_{ref}$, in other words $|S(h_s)|=\max_{66\ ref}(|S(h)|)$.

Other conditions may also be taken into account, such as for example the fact that the value $h_s$ is higher than or equal to a predefined non-zero minimum value $h_{th}$, for example in order to optimize the diffusion of the charge carriers in the plane XY within the first layer 11 from the reflective electrode 4.

In a step 400, the light-emitting diode 1 is produced such that the emitting dipoles are located at the distance $h_s$ from the reflective electrode 4. In the case where the active layer 13 has fixed dimensions, for example 3 nm for a quantum well layer and 12 nm for a barrier layer, the thickness de the first layer 11 is determined such that the sum of this thickness and of half of the active layer 13 is equal to the determined value $h_s$, for example to within 10 nm, or even to within 5 nm.

Thus, the emitting dipoles associated with the radiative recombination of the electron-hole pairs in the active layer 13 essentially have the chosen orientation $\theta_s$, for example here the horizontal orientation. The luminous efficacy of the light-emitting diode 1 is thus improved.

Additionally, the production method may comprise a phase of dimensioning the second layer 12 arranged between the active layer 13 and a second electrode (cathode). The second layer 12 and the active layer 13 form the same first uniform medium of refractive index $n_1$. This dimensioning phase is here identical or similar to those described previously and will not be detailed again. In this case, a third optically linear, uniform and isotropic medium, of refractive index $n_3$, may be the cathode, which may be transparent at the emission wavelength, or a dielectric medium (air, gas) surrounding the light-emitting diode 1. The luminous efficacy of the light-emitting diode 1 is thus improved further.

More precisely, a non-zero distance $h'_s$ between the emitting dipoles and the third uniform medium is determined such that the lifetime ($\tau_{n,s}$) of the emitting dipoles having the chosen orientation is longer than that of the emitting dipoles having the non-chosen orientation ($\tau_{n,ns}$), and preferably that the associated selectivity is maximum. Next, the light-emitting diode 1 is produced such that the thickness of the second layer 12 is such that the emitting dipoles are located at the determined distance $h'_s$ with respect to said third uniform medium.

Additionally, as mentioned above, it is advantageous for the chosen orientation $\theta_s$ of the emitting dipoles to be the horizontal orientation $\theta_h$ ($\theta=90°$) when the light extraction out of the light-emitting diode 1 does not induce a near-field coupling of dipole-dipole type with quantum dots or plasmonic particles located on the emission face of the light-emitting diode 1. Specifically, it is recognized that the luminous efficacy is increased when the emitting dipoles have the horizontal orientation $\theta_h$ ($\theta=90°$).

Figure 6:
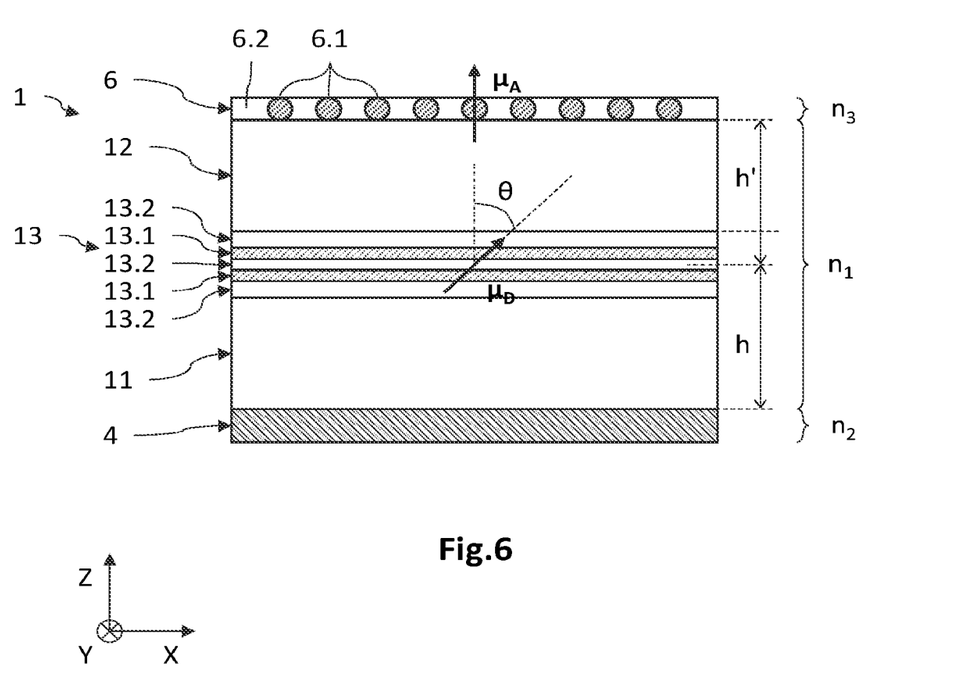
FIG. 6 is a schematic and partial cross-sectional view of a light-emitting diode obtained according to a production method according to one embodiment, comprising an extraction layer comprising metal nanoparticles.

However, when the light extraction induces a near-field coupling of dipole-dipole type, it is advantageous for the chosen orientation of the emitting dipoles to be a vertical orientation $\theta_v$ ($\theta=0°$). To this end, FIG. 6 is a schematic and partial cross-sectional view of a light-emitting diode 1, the extraction face of which is formed by a layer 6 comprising metal nanoscale particles 6.1 or quantum dots. What is meant by near field is that the distance between the acceptor and donor dipoles is shorter than or equal to $\lambda/5$, or even shorter than or equal to $\lambda/10$, where $\lambda$ is the emission wavelength of the radiation emitted by the active layer, by way of the refractive index of the medium, in which the electric field radiated by the dipole decreases by $1/r^3$.

The nanoscale particles 6.1 have an average diameter of the order of a few nanometers to a few hundreds of nanometers, for example are between 0.2 nm and 500 nm, and preferably between 2 nm and 150 nm. They may notably be metal particles and/or quantum dots. The particles are elements that are distinct from one another, and may be of any shape, for example spherical, angular, flattened or elongated, or any other shape. The size of the particles is here the smallest dimension of the particles and the average diameter is the arithmetic mean of the size of the particles.

In this example, the light-emitting diode 1 comprises a reflective electrode 4, a first semiconductor layer 11, an active layer 13 formed here of two quantum well layers 13.1 arranged between barrier layers 13.2, a second semiconductor layer 12, and an extraction layer 6. The extraction layer 6 comprises here metal particles 6.1 of nanoscale size preferably arranged in a transparent dielectric material 6.2.

The nanoscale particles 6.1 are made of a metal material, which may be chosen from among Ag, Cu, Au, Pt, Pd, Ni, Co, Rh, In, Ru, Fe, CuNi, inter alia, and from among the compounds formed from a mixture of at least two or more of these materials. The surface density of metal particles 6.1 is determined by Mie scattering so as to optimize the absorption efficiency of a metal particle 6.1 according to the refractive index of the dielectric medium. By way of example, for a dielectric medium with a refractive index of 1.5, an average diameter of 55 nm for nanoscale particles of silver makes it possible to optimize the absorption efficiency at 460 nm. The absorption cross section of these particles is then $0.5\times10^{-14}$ m$^2$ and the surface density may then be of the order of $2\times10^{14}$ m$^{-2}$. The transparent dielectric material 6.2 has a coefficient of transmission of the incident radiation that is at least equal to 50%, preferably at least equal to 75%, or even to 90%, or even more. It may be chosen from among silicone, polysiloxane, PDMSs, PMMA, PVA, oxide-based mineral layers of sol-gel type such as $SiO_2$, $Al_2O_3$, ZnO, $TiO_2$, inter alia.

Additionally, a near-field dipole-dipole coupling is present between the dipoles denoted here by $\mu_D$ (for donors) that are associated with the radiative recombination in the active layer 13 and the dipoles denoted here by $\mu_A$ (for acceptors) that are associated with the plasmonic emission. These dipoles $\mu_A$ and $\mu_D$ are the vectors of the dipole moments. The intensity of this coupling is characterized by the angular coupling factor $K^2$.

In a known manner, the angular coupling factor $K^2$ between the emitting dipoles $\mu_A$ and $\mu_D$ is defined by the relationship:

$$K^2=(n_A \cdot n_D - 3(n_A \cdot n_D)(n_r \cdot n_A))^2$$

This expression is notably described in the work by Novotny & Hecht 2006 on page 290 (equation 8.169). The factor $K^2$ is dependent on the orientation of the unit vectors $n_A$ and $n_D$ that are associated with the acceptor and donor dipoles, and on the unit vector $n_r$ linking the acceptor and donor dipoles in question.

Here, the plasmonic resonant mode of the metal particles 6.1 corresponds to acceptor dipoles that are located in the near field of the donor dipoles. The dipole-dipole interaction modifies the absorption properties of the acceptor dipoles. There is a non-radiative transfer of energy between the donor dipoles and the acceptor dipoles, called FRET (Förster resonance energy transfer) coupling, which is manifested by an increase in the luminous efficacy of the light-emitting diode 1.

It is seen that the angular coupling factor $K^2$ is maximum when the donor $\mu_D$ and acceptor $\mu_A$ dipoles are collinear, in which case the factor $K^2$ is equal to 4. Thus, dimensioning the first layer 11 and, advantageously, the second layer 12 in order to obtain a predominant orientation of the donor dipoles $\mu_D$ that is vertical allows the donor and acceptor dipoles to be made collinear, and thus the luminous efficacy of the light-emitting diode 1 to be improved further.

Specifically, in the case where the extraction layer 6 comprises metal particles 6.1, the luminous efficacy of the light-emitting diode 1 is further increased by an additional luminous emission by plasmonic effect. The metal particles 6.1 may thus emit a luminous radiation at a resonance wavelength that is substantially identical to the electroluminescence wavelength $\lambda_e$ of the light-emitting diode 1. For that, plasmonic modes of the metal particles 6.1 are excited, a resonant mode of which may result in the emission of the additional luminous radiation. Here, the plasmonic resonant mode of the metal particles 6.1 corresponds to acceptor dipoles $\mu_A$ that are located in the near field of the donor dipoles $\mu_D$.

In the case where the nanoscale particles 6.1 are quantum dots, they may be produced in the form of semiconductor nanocrystals, the average size of which may be between 0.2 nm and 500 nm, for example between 1 nm and 100 nm, and notably between 2 nm and 30 nm. The semiconductor material of the nanocrystals may notably be chosen from among cadmium selenide (CdSe), indium phosphide (InP), cadmium sulfide (CdS), zinc sulfide (ZnS), cadmium oxide (CdO), cadmium zinc selenide (CdZnSe), or from among other potentially suitable semiconductor materials. The surface density is here notably dependent on the desired light conversion efficiency, i.e. on the ratio of the intensity of the photoluminescence radiation emitted by the quantum dots 6.1 to the intensity of the electroluminescence radiation emitted by the active layer 13. The extraction layer 6 then provides an additional color conversion function, by converting a portion of the luminous radiation emitted by the active layer 13 into a luminous radiation of longer wavelength.

The nanoscale particles 6.1 may also be plasmon-effect quantum dots, produced for example from a metal core surrounded by a dielectric sheath, itself surrounded by a layer forming a quantum dot. The metal core, for example made of silver, forms an absorbent antenna for the dipole-dipole coupling, and couples this absorbed energy with the material forming the quantum dot, which will subsequently emit a photoluminescence radiation.

Particular embodiments have just been described. Various modifications and variants will be apparent to a person skilled in the art.

The invention claimed is:

1. A method for producing at least one light-emitting diode comprising a stack formed of a first semiconductor layer, of a second semiconductor layer, and of an active layer located between the two semiconductor layers, a reflective electrode extending in contact with the first semiconductor layer, the method comprising the following steps:
choosing the materials of the first semiconductor layer and of the active layer, and of the reflective electrode;
choosing an orientation, with respect to a plane of the active layer, of the emitting dipoles that are associated with the radiative recombination of electron-hole pairs in the active layer, from among:
a horizontal orientation for which the emitting dipoles are oriented so as to be parallel to the plane of the active layer, and
a vertical orientation for which the emitting dipoles are oriented so as to be orthogonal to the plane of the active layer;
determining a non-zero distance between the emitting dipoles and the reflective electrode, for which a lifetime of the emitting dipoles having the chosen orientation is longer than that of the emitting dipoles having the non-chosen orientation,
on the basis of a predetermined function expressing a change in a parameter representative of the lifetime of an emitting dipole having either of said orientations according to its distance from the reflective electrode, taking into account the optical properties of said materials chosen;
choosing the materials of the second semiconductor layer, and of a third medium covering the second semiconductor layer;
determining a non-zero distance between the emitting dipoles and said third medium, for which a lifetime of the emitting dipoles having the chosen orientation is longer than that of the emitting dipoles having the non-chosen orientation, on the basis of a predetermined function expressing a change in a parameter representative of the lifetime of an emitting dipole having either of said orientations according to its distance from said third medium, taking into account the optical properties of said materials chosen;

producing the light-emitting diode, a thickness of the first semiconductor layer being such that the emitting dipoles are located at the determined distance with respect to the reflective electrode, and a thickness of the second semiconductor layer being such that the emitting dipoles are located at the determined distance with respect to said third medium.

2. The method as claimed in claim 1, wherein the determining step comprises the following sub-steps:

determining, over a predefined distance range, the change according to the distance in the parameter representative of the lifetime of the emitting dipole having the chosen orientation, and the change according to the distance in the parameter representative of the lifetime of the emitting dipole having the non-chosen orientation;

determining a difference parameter representative of a difference in the parameter representative of the lifetime of the emitting dipole having the chosen orientation with respect to the parameter representative of the lifetime of the emitting dipole having the non-chosen orientation, over said predefined distance range;

determining said distance such that:

the parameter representative of the lifetime of the emitting dipole having the chosen orientation is greater, for the determined distance, than that of the parameter representative of the lifetime of the emitting dipole having the non-chosen orientation, and that the difference parameter has, for the determined distance, a maximum value over at least a portion of the distance range.

3. The method as claimed in claim 1, wherein the determined distance is defined along an axis orthogonal to the plane of the active layer, between, on the one hand, the interface between the reflective electrode and the first semiconductor layer and, on the other hand, a plane passing through halfway through the thickness of the active layer.

4. The method as claimed in claim 1, wherein the active layer comprises at least one quantum well emissive layer, and a barrier layer located between the first semiconductor layer and the emissive layer, the determined distance being defined along an axis orthogonal to the plane of the active layer, between, on the one hand, the interface between the reflective electrode and the first semiconductor layer and, on the other hand, a plane passing through halfway through the thickness of the emissive layer.

5. The method as claimed in claim 1, wherein the reflective electrode extends parallel to the plane of the active layer.

6. The method as claimed in claim 1, wherein the reflective electrode is an anode capable of injecting holes into the semiconductor stack.

7. The method as claimed in claim 1, wherein the first semiconductor layer is made of a P-doped semiconductor crystalline material, or made of a hole-conducting organic semiconductor material.

8. The method as claimed in claim 1, wherein the second semiconductor layer is coated with an extraction layer comprising nanoscale particles chosen from among quantum dots or metal particles.

9. The method as claimed in claim 8, wherein the nanoscale particles are metal particles, and wherein the chosen orientation is a vertical orientation.

* * * * *